United States Patent
Chiang et al.

(10) Patent No.: US 12,354,634 B2
(45) Date of Patent: *Jul. 8, 2025

(54) TRANSISTORLESS MEMORY CELL

(71) Applicant: Taiwan Semiconductor Manufacturing Company, Ltd., Hsinchu (TW)

(72) Inventors: Katherine Chiang, New Taipei (TW); Chung Te Lin, Tainan (TW); Min Cao, Hsinchu (TW); Yuh-Jier Mii, Hsin-Chu (TW); Sheng-Chih Lai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,358

(22) Filed: Apr. 11, 2024

(65) Prior Publication Data
US 2024/0257853 A1    Aug. 1, 2024

Related U.S. Application Data

(63) Continuation of application No. 17/392,583, filed on Aug. 3, 2021, now Pat. No. 11,990,169, which is a
(Continued)

(51) Int. Cl.
*G11C 11/16*    (2006.01)
*H10B 61/00*    (2023.01)
(Continued)

(52) U.S. Cl.
CPC ........ *G11C 11/1659* (2013.01); *G11C 11/161* (2013.01); *H10B 61/00* (2023.02);
(Continued)

(58) Field of Classification Search
CPC ..................................................... G11C 11/02
(Continued)

(56) References Cited

U.S. PATENT DOCUMENTS 5,321,657 A     6/1994  Arimoto et al.
7,869,266 B2 *  1/2011  Ranjan ................... H10B 61/00
                                              365/158

(Continued)

FOREIGN PATENT DOCUMENTS

DE    102015221521 A1    4/2017
FR       2828001 B1      1/2003

OTHER PUBLICATIONS

Freescale Semiconductor. "MRAM Technical Guide." Published in 2007.
(Continued)

*Primary Examiner* — Anthan Tran
(74) *Attorney, Agent, or Firm* — Eschweiler & Potashnik, LLC

(57) ABSTRACT

In some embodiments, the present disclosure relates to an integrated chip. The integrated chip includes an operative memory device. A regulating access apparatus is coupled to the operative memory device. The regulating access apparatus includes one or more regulating MTJ devices respectively having a regulating free layer, a regulating dielectric barrier layer, and a regulating pinned layer separated from the regulating free layer by the regulating dielectric barrier layer. The regulating pinned layer continuously extends between opposing outermost sidewalls of the regulating dielectric barrier layer.

20 Claims, 11 Drawing Sheets

Related U.S. Application Data continuation of application No. 16/122,057, filed on Sep. 5, 2018, now Pat. No. 11,094,361.

(51) Int. Cl.
  *H10N 50/01* (2023.01)
  *H10N 50/80* (2023.01)
  *H10N 50/85* (2023.01)

(52) U.S. Cl.
  CPC ............ *H10N 50/01* (2023.02); *H10N 50/80* (2023.02); *H10N 50/85* (2023.02); *G11C 11/1655* (2013.01); *G11C 11/1657* (2013.01)

(58) Field of Classification Search
  USPC .......................................................... 365/158
  See application file for complete search history.

(56) References Cited

U.S. PATENT DOCUMENTS

| | | | |
|---|---|---|---|
| 11,990,169 B2* | 5/2024 | Chiang | ................. H10N 50/01 |
| 2005/0083760 A1 | 4/2005 | Subramanian et al. | |
| 2007/0171704 A1* | 7/2007 | Hung | ................. G11C 11/5607 |
| | | | 365/158 |
| 2009/0168493 A1 | 7/2009 | Kim et al. | |
| 2009/0231909 A1 | 9/2009 | Dieny et al. | |
| 2012/0075906 A1 | 3/2012 | Ho et al. | |
| 2013/0322163 A1 | 12/2013 | Ueda | |
| 2014/0071741 A1 | 3/2014 | Kim et al. | |
| 2014/0269035 A1 | 9/2014 | Manipatruni et al. | |
| 2014/0334216 A1 | 11/2014 | Wang et al. | |
| 2015/0069630 A1 | 3/2015 | Sciarrillo | |
| 2016/0125928 A1 | 5/2016 | Pileggi et al. | |
| 2017/0148903 A1 | 5/2017 | Manipatruni et al. | |
| 2018/0248553 A1 | 8/2018 | Pan et al. | |
| 2018/0309047 A1 | 10/2018 | Sasioglu et al. | |

OTHER PUBLICATIONS

Non-Final Office Action dated Feb. 5, 2020 for U.S. Appl. No. 16/122,057.
Final Office Action dated Jun. 11, 2020 for U.S. Appl. No. 16/122,057.
Non-Final Office Action dated Oct. 29, 2020 for U.S. Appl. No. 16/122,057.
Notice of Allowance dated Apr. 12, 2021 for U.S. Appl. No. 16/122,057.
Non-Final Office Action dated Nov. 10, 2022 for U.S. Appl. No. 17/392,583.
Final Office Action dated May 22, 2023 for U.S. Appl. No. 17/392,583.
Non-Final Office Action dated Aug. 17, 2023 for U.S. Appl. No. 17/392,583.
Notice of Allowance dated Jan. 18, 2024 for U.S. Appl. No. 17/392,583.

* cited by examiner

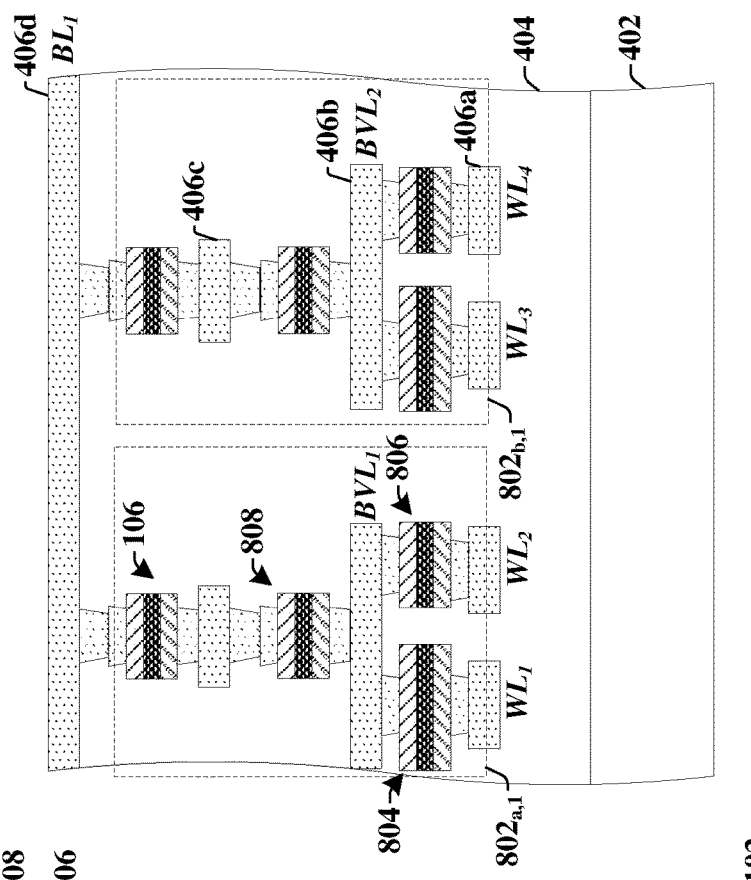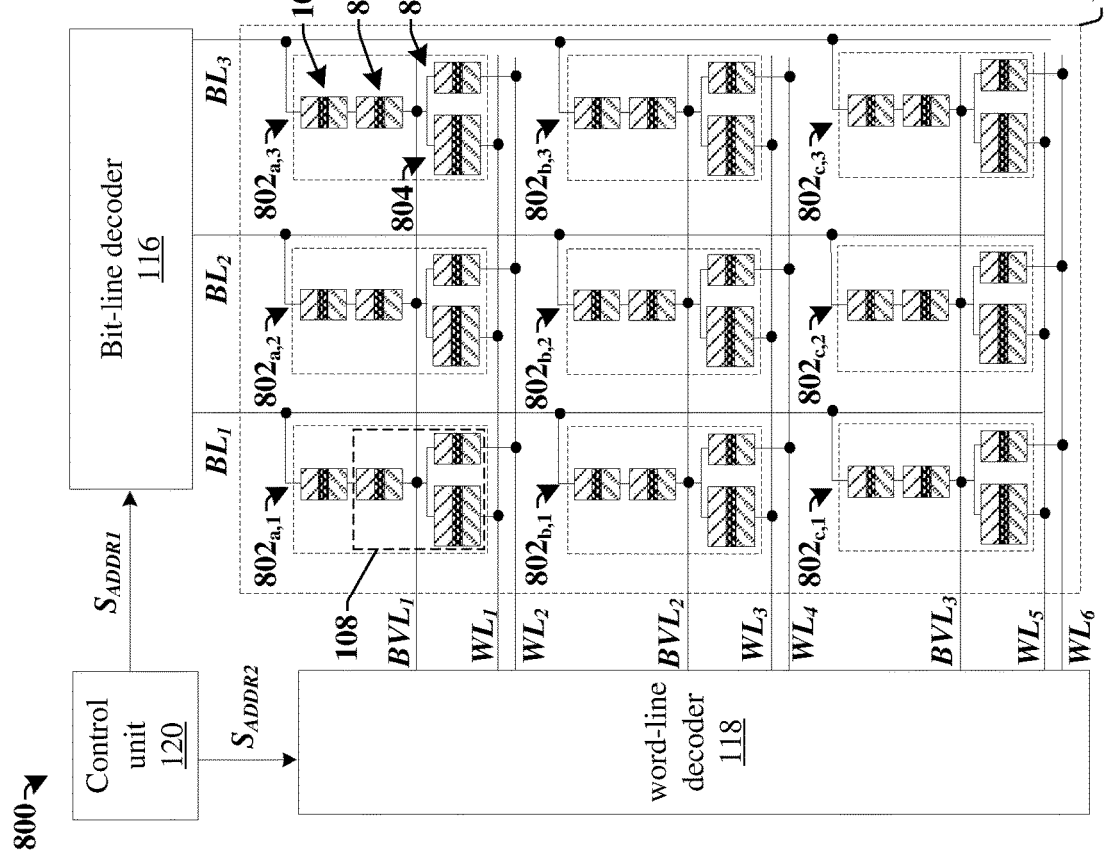
Fig. 8B
Fig. 8A

TRANSISTORLESS MEMORY CELL

REFERENCE TO RELATED APPLICATIONS

This Application is a Continuation of U.S. application Ser. No. 17/392,583, filed on Aug. 3, 2021, which is a Continuation of U.S. application Ser. No. 16/122,057, filed on Sep. 5, 2018 (now U.S. Pat. No. 11,094,361, issued on Aug. 17, 2021). The contents of the above-referenced Patent Applications are hereby incorporated by reference in their entirety.

BACKGROUND

Many modern-day electronic devices contain electronic memory configured to store data. Electronic memory may be volatile memory or non-volatile memory. Volatile memory stores data when it is powered, while non-volatile memory is able to store data when power is removed. Magneto-resistive random-access memory (MRAM) is one promising candidate for a next generation non-volatile memory technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8B illustrate some additional embodiments of a memory circuit having a regulating access apparatus configured to selectively provide access to an operative MTJ device.

DETAILED DESCRIPTION

Figure 1:
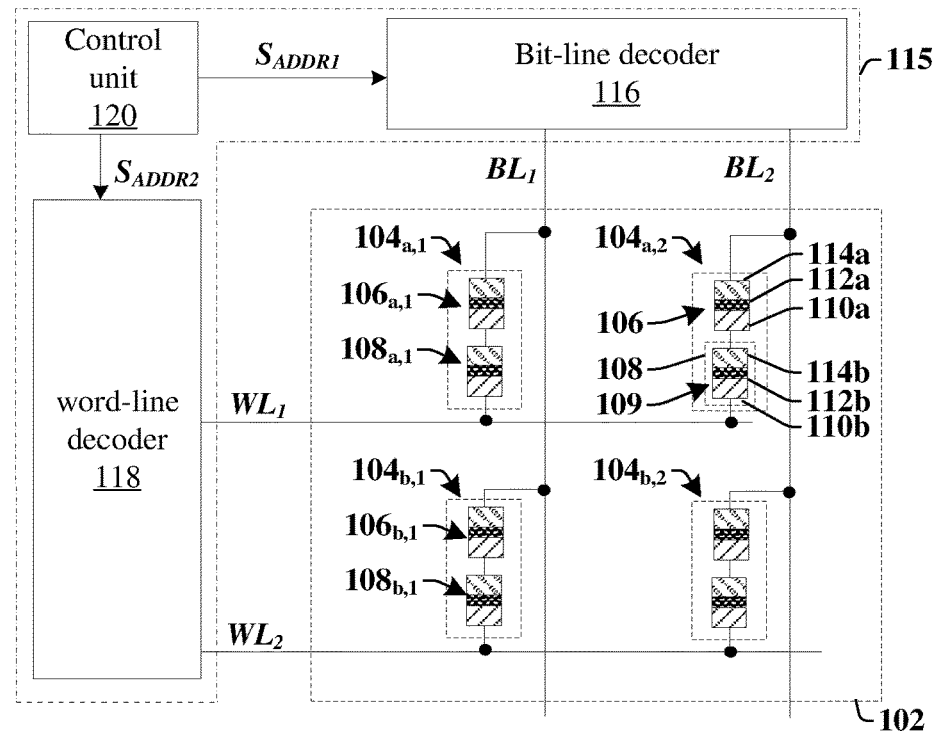
FIG. 1 illustrates a schematic diagram of some embodiments of a memory circuit having a regulating access apparatus configured to selectively provide access to an operative magnetic tunnel junction (MTJ) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) cells comprise a magnetic tunnel junction (MTJ) vertically arranged between conductive electrodes. The MTJ comprises a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned layer. The parallel configuration provides for a low resistance state that digitally stores data as a first bit value (e.g., a logical "1"). The anti-parallel configuration provides for a high resistance state that digitally stores data as a second bit value (e.g., a logical "0").

As the functionality of integrated chips increases, the need for more memory also increases, causing integrated chip designers and manufacturers to increase the amount of available memory while decreasing the size and power consumption of an integrated chip. To reach this goal, the size of memory cell components has been aggressively shrunk over the past few decades. One advantage of MTJ devices over other memory types is that the MTJ of an MTJ device can be made to be a very small size. However, in MRAM cells a driving transistor (i.e., an access transistor) is used to selectively provide a voltage and/or current to an associated MTJ device during read and/or write operations. Because MRAM cells generally use a relatively high voltage and/or current for the write operations, the size of the driving transistor may be relatively large. While an MTJ of an MRAM cell can be made to have a small size, the relatively large size of the driving transistor limits how small MRAM cells within a memory array can be shrunk.

The present disclosure, in some embodiments, relates to an integrated chip comprising a memory array having a plurality of memory cells (e.g., MRAM cells) that do not comprise driving transistors (i.e., that do not use driving transistors to provide a voltage and/or current to a memory cell). Rather, the plurality of memory cells respectively comprise a regulating access apparatus configured to selectively provide access to operative MTJ devices within the memory array. The regulating access apparatus has one or more regulating MTJ devices coupled to an operative MTJ device. The one or more regulating MTJ devices are configured to selectively provide access to the operative MTJ device by controlling (i.e., regulating) a current that is provided to the operative MTJ device. By using the regulating access apparatus to selectively provide access to operative MTJ devices within a memory array, a size of memory cells (e.g., MRAM cells) within the memory array can be decreased because the size is no longer dependent on a size of a driving transistor.

FIG. 1 illustrates a schematic diagram of some embodiments of a memory circuit 100 having a regulating access apparatus configured to selectively provide access to an operative MTJ device.

The memory circuit 100 comprises a memory array 102 having a plurality of memory cells $104_{a,1}$-$104_{b,2}$. The plurality of memory cells $104_{a,1}$-$104_{b,2}$ are arranged within the memory array 102 in rows and/or columns. For example, a first row of memory cells comprises memory cells $104_{a,1}$ and $104_{a,2}$, while a first column of memory cells comprises memory cells $104_{a,1}$ and $104_{b,1}$. In some embodiments, the plurality of memory cells $104_{a,1}$-$104e$, 2 may comprise a plurality of MRAM cells.

The plurality of memory cells $104_{a,1}$-$104_{b,2}$ (e.g., MRAM cells) respectively comprise an operative MTJ device 106 coupled to a regulating access apparatus 108. The operative MTJ device 106 comprises a magnetic tunnel junction (MTJ) having a pinned layer 110a separated from a free layer 114a by a dielectric tunnel barrier 112a. The pinned layer 110a has a magnetization that is fixed, while the free layer 114a has a magnetization that can be changed during operation (through the tunnel magnetoresistance (TMR) effect) to be either parallel (i.e., a 'P' state) or anti-parallel (i.e., an 'AP' state) with respect to the magnetization of the pinned layer 110a. A relationship between the magnetizations of the pinned layer 110a and the free layer 114a define a resistive state of the MTJ and thereby enables the plurality of memory cells $104_{a,1}$-$104b_{b,2}$ to respectively store a data state having a value that is based upon a resistance of the operative MTJ device 106 within a memory cell. For example, a first memory cell $104_{a,1}$ will either store a first bit value (e.g., a logical "0") if a first operative MTJ device $106_{a,1}$ has a low resistive state or a second bit value (e.g., a logical "1") if the first operative MTJ device $106_{a,1}$ has a high resistive state.

The regulating access apparatus 108 respectively have a resistance by which a current that is being provided to an associated operative MTJ device 106 can be controlled. For example, a first regulating access apparatus $108_{a,1}$ is configured to control a current that is provided to a first operative MTJ device $106_{a,1}$, a second regulating access apparatus $108_{b,1}$ is configured to control a current that is provided to a second operative MTJ device $106_{b,1}$, etc. The regulating access apparatus 108 are configured to selectively provide access to one or more operative MTJ devices 106 within the memory array 102 by controlling a current that is provided to the operative MTJ devices 106.

In some embodiments, the regulating access apparatus 108 may comprise one or more regulating MTJ devices 109, which respectively comprise a MTJ having a pinned layer 110b separated from a free layer 114b by a dielectric tunnel barrier 112b. For example, in some embodiments, the regulating access apparatus 108 may comprise a first regulating MTJ device and a second regulating MTJ device 206 coupled in parallel to an associated operative MTJ device 106. In some embodiments, the first regulating MTJ device, the second regulating MTJ device, and the operative MTJ device 106 respectively comprise a MTJ having a pinned layer separated from a free layer by a dielectric tunnel barrier. In some embodiments, the pinned layer 110 may comprise cobalt (Co), iron (Fe), boron (B), nickel (Ni), ruthenium (Ru), iridium (Ir), platinum (Pt), or the like. In some embodiments, the dielectric tunnel barrier may comprise magnesium oxide (MgO), aluminum oxide ($Al_2O_3$), or the like. In some embodiments, the free layer may comprise cobalt (Co), iron (Fe), boron (B), or the like.

In other embodiments, the regulating access apparatus 108 may comprise one or more resistors (e.g., thin film resistors comprising tantalum nitride, tantalum, titanium nitride, titanium, tungsten, or the like). For example, in some embodiments, the regulating access apparatus 108 may comprise a first thin film resistor and a second thin film resistor coupled in parallel to the operative MTJ device 106. In various embodiments, the regulating access apparatus 108 may comprise resistors having substantially similar sizes or having different sizes.

The memory array 102 is coupled to control circuitry 115 by way of a plurality of bit-lines $BL_1$-$BL_2$ and a plurality of word-lines $WL_1$-$WL_2$. In some embodiments, the control circuitry 115 comprises a bit-line decoder 116 coupled to the plurality of bit-lines $BL_1$-$BL_2$ and a word-line decoder 118 coupled to the plurality of word-lines $WL_1$-$WL_2$. The regulating access apparatus 108 is coupled between a word-line $WL_x$ (x=1 or 2) and an operative MTJ device 106, while the operative MTJ device 106 is coupled between the regulating access apparatus 108 and a bit-line $BL_y$ (y=1 or 2).

To access an operative MTJ device 106, the bit-line decoder 116 is configured to selectively provide signals (e.g., voltages) to one or more of the bit-lines $BL_1$-$BL_2$ based upon an address $S_{ADDR1}$ received from a control unit 120, while the word-line decoder 118 is configured to selectively provide signals (e.g., voltages) to one or more of the word-lines $WL_1$-$WL_2$ based upon an address $S_{ADDR2}$ received from the control unit 120. The regulating access apparatus 108 is configured to regulate a current that the signals provide to an associated operative MTJ device 106, and thereby selectively provide access to the associated operative MTJ device 106. For example, during a write operation, the regulating access apparatus 108 within the memory array 102 may provide a current that is greater than or equal to a minimum switching current (i.e., a current that is sufficient to enable a data state of a memory cell to change) to an operative MTJ device within a selected memory cell, while providing a current that is less than the minimum switching current to operative MTJ devices within unselected memory cells.

Using the regulating access apparatus 108 to selectively provide access to an operative MTJ device 106 provides for memory cells without a driving transistor. Having memory cells without a driving transistor allows for a size of the memory array 102 to be reduced, thereby improving performance and decreasing a cost of the memory circuit 100.

Figure 2:
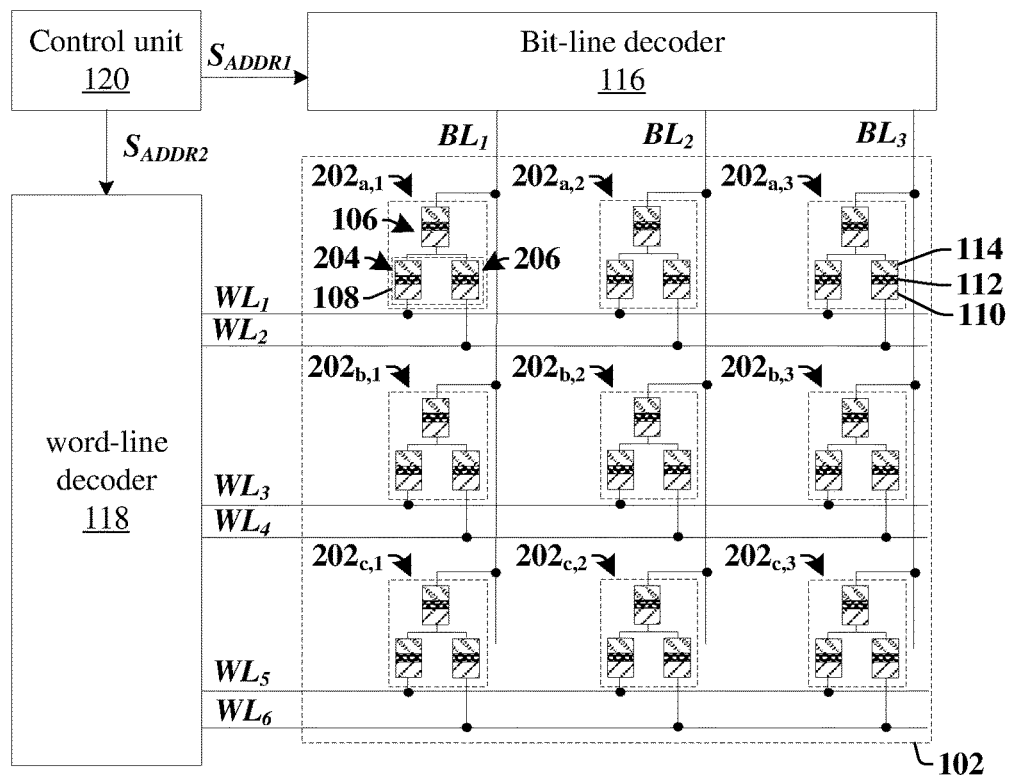
FIG. 2 illustrates a schematic diagram of some additional embodiments of a memory circuit having a regulating access apparatus comprising regulating MTJ devices configured to selectively provide access to an operative MTJ device.

FIG. 2 illustrates a schematic diagram of some additional embodiments of a memory circuit 200 having a regulating access apparatus comprising regulating MTJ devices configured to selectively provide access to an operative MTJ device.

The memory circuit 200 comprises a memory array 102 having a plurality of memory cells $202_{a,1}$-$202_{c,3}$ (e.g., MRAM cells) arranged in rows and columns. The plurality of memory cells $202_{a,1}$-$202_{c,3}$ respectively comprise an operative MTJ device 106 configured to store data and a regulating access apparatus 108 configured selectively provide access to the operative MTJ device 106 by regulating a current that is provided to the operative MTJ device 106.

In some embodiments, the regulating access apparatus 108 comprises a first regulating MTJ device 204 and a second regulating MTJ device 206 coupled to a same layer of the operative MTJ device 106. For example, the first regulating MTJ device 204 and the second regulating MTJ device 206 may both be coupled to a pinned layer 110 of the operative MTJ device 106. In some embodiments, the first regulating MTJ device 204 is coupled between the operative MTJ device 106 and a first word-line $WL_x$ (x=1,3,5), and the second regulating MTJ device 206 is coupled between the operative MTJ device 106 and a second word-line $WL_y$ (y=2,4,6). For example, in a first memory cell $202_{a,1}$ a first regulating MTJ device 204 is coupled between an operative MTJ device 106 and word-line $WL_1$, while a second regulating MTJ device 206 is coupled between the operative MTJ device 106 and word-line $WL_2$.

The first regulating MTJ device 204, the second regulating MTJ device 206, and the operative MTJ device 106 respectively comprise a MTJ having a pinned layer 110 separated from a free layer 114 by a dielectric tunnel barrier 112. In some embodiments, the pinned layer 110 may comprise cobalt (Co), iron (Fe), boron (B), nickel (Ni), ruthenium (Ru), iridium (Ir), platinum (Pt), or the like. In some embodiments, the dielectric tunnel barrier 112 may comprise magnesium oxide (MgO), aluminum oxide ($Al_2O_3$), or the like. In some embodiments, the free layer 114 may comprise cobalt (Co), iron (Fe), boron (B), or the like.

During operation, a word-line decoder 118 is configured to selectively apply signals to one or more word-lines $WL_1$-$WL_6$ coupled to the memory array 102 and a bit-line decoder 116 is configured to selectively apply signals to one or more bit-lines $BL_1$-$BL_3$ coupled to the memory array 102. By selectively applying signals to the one or more word-lines $WL_1$-$WL_6$ and the one or more bit-lines $BL_1$-$BL_3$, different ones of the plurality of operative MTJ devices 106 can be selectively accessed in a mutually exclusive way.

Figure 3A:
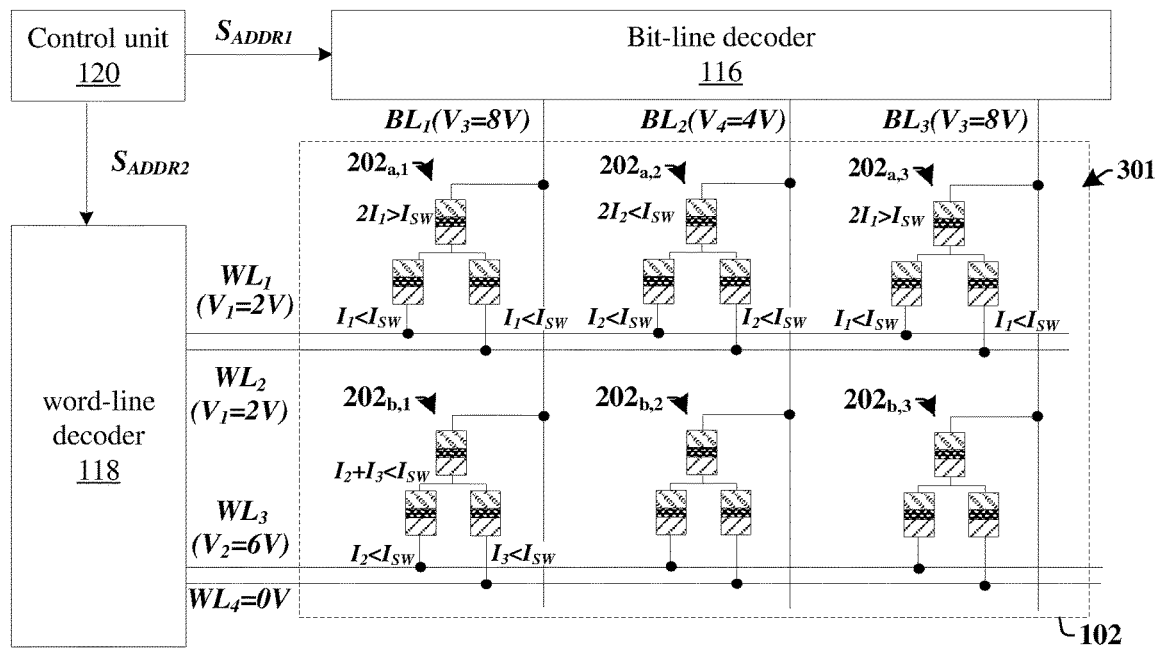
FIGS. 3A-3C illustrate schematic diagrams of some embodiments of read and write operations of the disclosed memory circuit of FIG. 2.
Figure 3B:
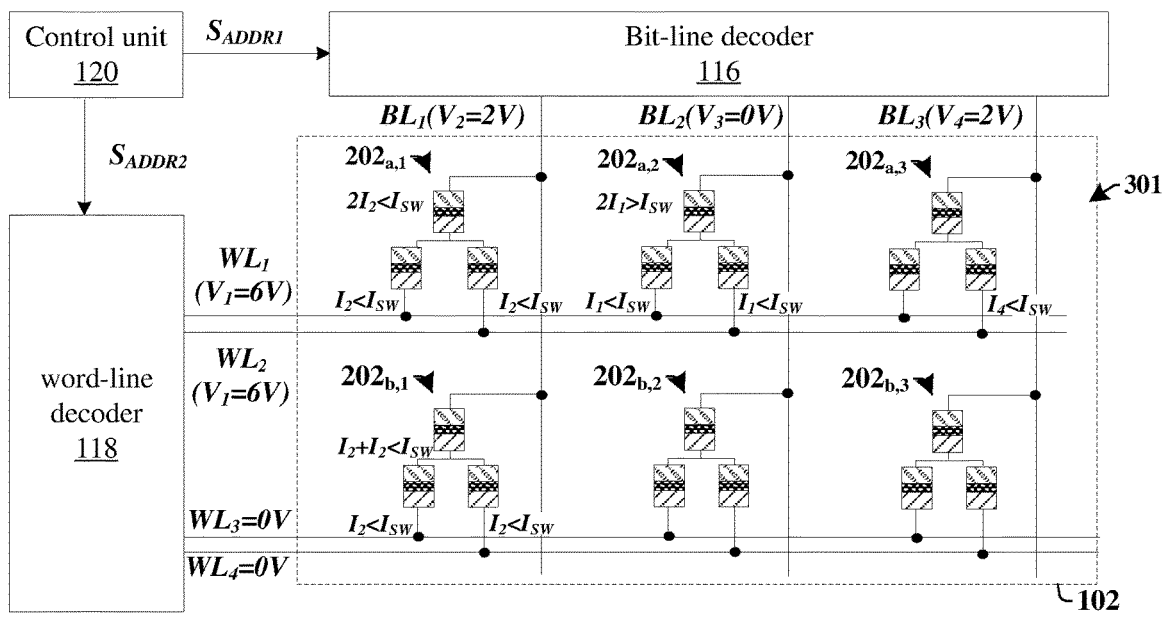

For example, FIGS. 3A-3B illustrate schematic diagrams, 300 and 302, of some embodiments of a write operation of the memory circuit 200 of FIG. 2. The write operation shown in schematic diagrams, 300 and 302, are one non-limiting example of a method of performing a write operation. In other embodiments, other methods of performing a write operation may alternatively be used.

The write operation illustrated in FIGS. 3A-3B writes a first data state to one or more memory cells in a row of a memory array during a first act (shown in FIG. 3A) and subsequently writes a second data state to one or more memory cells in the row of the memory array during a subsequent second act (shown in FIG. 3B), so as to use a 2-step process to write data to an entire row of a memory array 102. It will be appreciated that to write data to an MTJ device, the current provided through the MTJ device must be larger than a switching current (i.e., a critical switching current). Currents that are not larger than the switching current will not cause a switching between resistive states and therefore will not write data to MTJ devices within the memory array 102. In some embodiments, the disclosed write operation may be performed with the regulating MTJ devices (e.g., 204-206 in FIG. 2) in a high resistive state, so as to provide isolation between selected and unselected cells.

As shown in schematic diagram 300 of FIG. 3A, the first act of the write operation is performed by writing a first data state to operative MTJ devices within a first memory cell $202_{a,1}$ and a third memory cell $202_{a,3}$ in a first row 301 of the memory array 102. The first act of the write operation is performed by applying a first non-zero bias voltage $V_1$ (e.g., 2 V) to word-lines $WL_1$ and $WL_2$, a second non-zero bias voltage $V_2$ (e.g., 6 V) to word-line $WL_3$, a third non-zero bias voltage $V_3$ (e.g., 8 V) to bit-lines $BL_1$ and $BL_3$, and a fourth non-zero bias voltage $V_4$ (e.g., 4 V) to bit-line $BL_2$. A difference between the first non-zero bias voltage $V_1$ (e.g., 2 V) and the third non-zero bias voltage $V_3$ (e.g., 8 V) causes a first current $I_1$ to flow through regulating MTJ devices within the first memory cell $202_{a,1}$ and the third memory cell $202_{a,3}$. The first current $I_1$ is less than the switching current $I_{SW}$ so that the state of the regulating MTJ devices within the first memory cell $202_{a,1}$ and the third memory cell $202_{a,3}$ does not change. However, the current from the regulating MTJ devices adds together, so that a current that is twice the first current $I_1$ flows through operative MTJ devices within the first memory cell $202_{a,1}$ and the third memory cell $202_{a,3}$. The current that is twice the first current $I_1$ is larger than the switching current $I_{SW}$ so as to cause a first data state to be written to operative MTJ devices within the first memory cell $202_{a,1}$ and the third memory cell $202_{a,3}$.

An operative MTJ device within the second memory cell $202_{a,2}$ is not affected by the first act of the write operation because a difference between the first non-zero bias voltage $V_1$ (e.g., 2 V) and the fourth non-zero bias voltage $V_4$ (e.g., 4 V) causes a second current $I_2$ to flow through the regulating MTJ devices within the second memory cell $202_{a,2}$. However, twice the second current $I_2$ is smaller than the switching current $I_{SW}$ so that a data state is not written to an operative MTJ device within the second memory cell $202_{a,2}$. Similarly, operative MTJ devices coupled to word-lines $WL_3$ and $WL_4$ are also unaffected by the first act of the write operation.

As shown in schematic diagram 302 of FIG. 3B, the second act of the write operation is performed by writing a second data state to an operative MTJ device within a second memory cell $202_{a,2}$ in the first row 301 of the memory array 102. The second act of the write operation is performed by applying a first non-zero bias voltage $V_1$ (e.g., 6 V) to word-lines $WL_1$ and $WL_2$, a second non-zero bias voltage $V_2$ (e.g., 2 V) to bit-lines $BL_1$ and $BL_3$, and a third bias voltage $V_3$ (e.g., 0 V) to bit-line $BL_2$. A difference between the first non-zero bias voltage $V_1$ (e.g., 6 V) and the third bias voltage $V_3$ (e.g., 0 V) causes a first current $I_1$ to flow through regulating MTJ devices within the second memory cell $202_{a,2}$. The first current $I_1$ is less than the switching current $I_{SW}$ so that the states of regulating MTJ devices within the second memory cell $202_{a,2}$ do not change. However, twice the first current $I_1$ (which flows through the operative MTJ device within the second memory cell $202_{a,2}$) is larger than the switching current $I_{SW}$ so as to cause the second data state to be written to an operative MTJ device within the second memory cell $202_{a,2}$.

Operative MTJ devices within the first memory cell $202_{a,1}$ and the third memory cell $202_{a,3}$ are not affected by the second act of the write operation because a difference between the first non-zero bias voltage $V_1$ (e.g., 6 V) and the second non-zero bias voltage $V_2$ (e.g., 2 V) causes a second current $I_2$ that is smaller than the switching current to flow through regulating MTJ devices within the first memory cell $202_{a,1}$ and the third memory cell $202_{a,3}$. However, twice the second current $I_2$ is smaller than the switching current $I_{SW}$ so that a data state is not written to operative MTJ devices within the first memory cell $202_{a,1}$ and the third memory cell $202_{a,3}$.

Figure 3C:
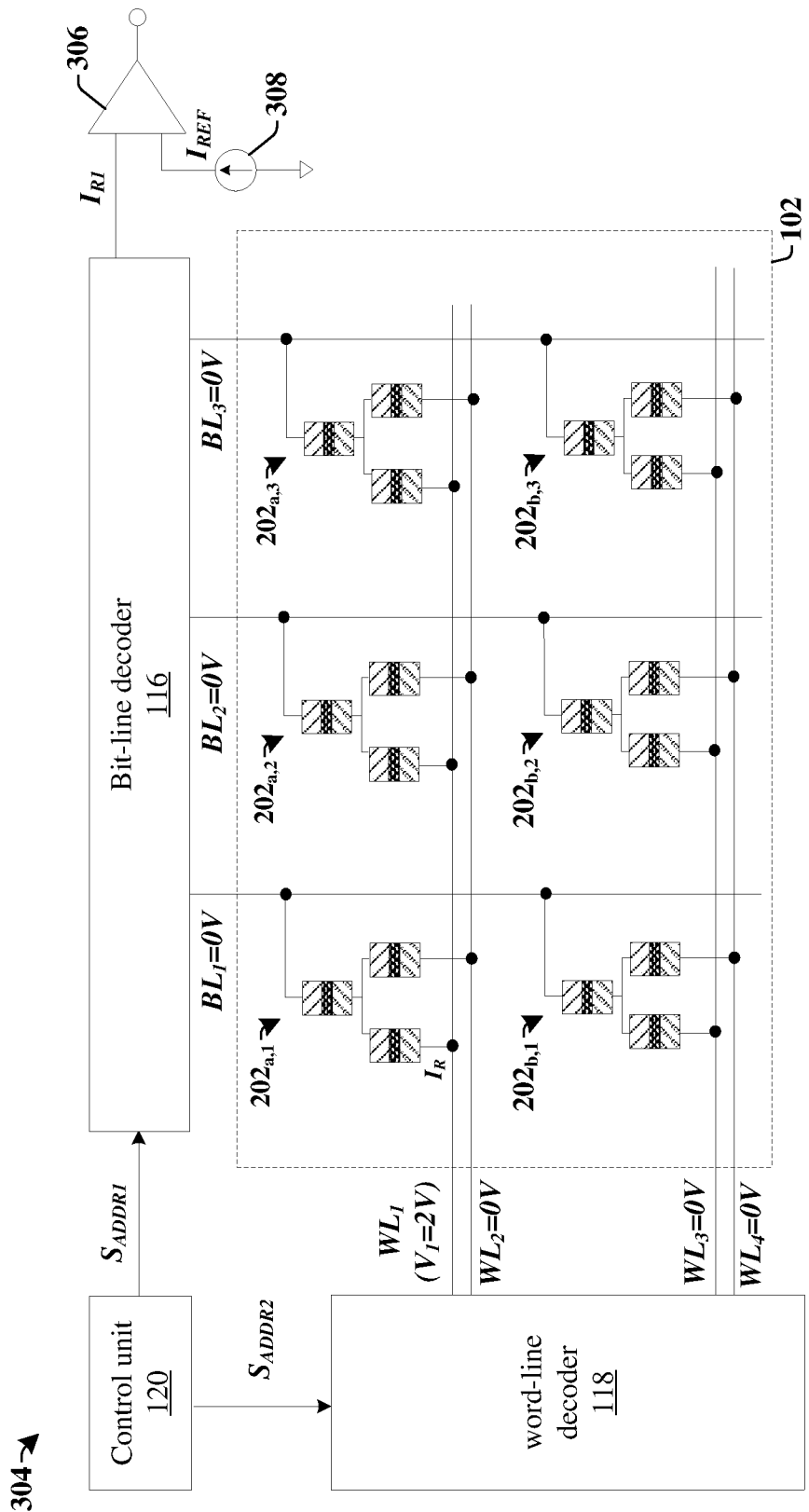

FIG. 3C illustrates some embodiments of a schematic diagram 304 showing a read operation that reads a data state from an operative MTJ device.

As shown in schematic diagram 304, a read operation is performed on a first operative MTJ device within the first memory cell $202_{a,1}$ by applying a first non-zero bias voltage $V_1$ (e.g., 2 V) to word-line $WL_1$. The first non-zero bias voltage $V_1$ will cause a read current $I_R$ to pass through the first operative MTJ device within the first memory cell $202_{a,1}$. The read current $I_R$ passing through the first operative MTJ device has a value that is dependent upon a resistive state of the first operative MTJ device. For example, if the first operative MTJ device is in a low resistive state (e.g., storing a logical '0') the read current $I_R$ will be greater than if the first operative MTJ device is in a high resistive state (e.g., storing a logical '1').

In some embodiments, the bit-line decoder 116 may comprise a multiplexor configured to determine a desired output of the memory array 102. The multiplexor is configured to selectively provide the read current $I_R$ from the first operative MTJ device within the first memory cell $202_{a,1}$ to a sense amplifier 306 that is configured to compare the current $I_R$ to a reference current $I_{REF}$ generated by a current source 308 to determine a data state stored in the first operative MTJ device within the first memory cell $202_{a,1}$.

Figure 4A:
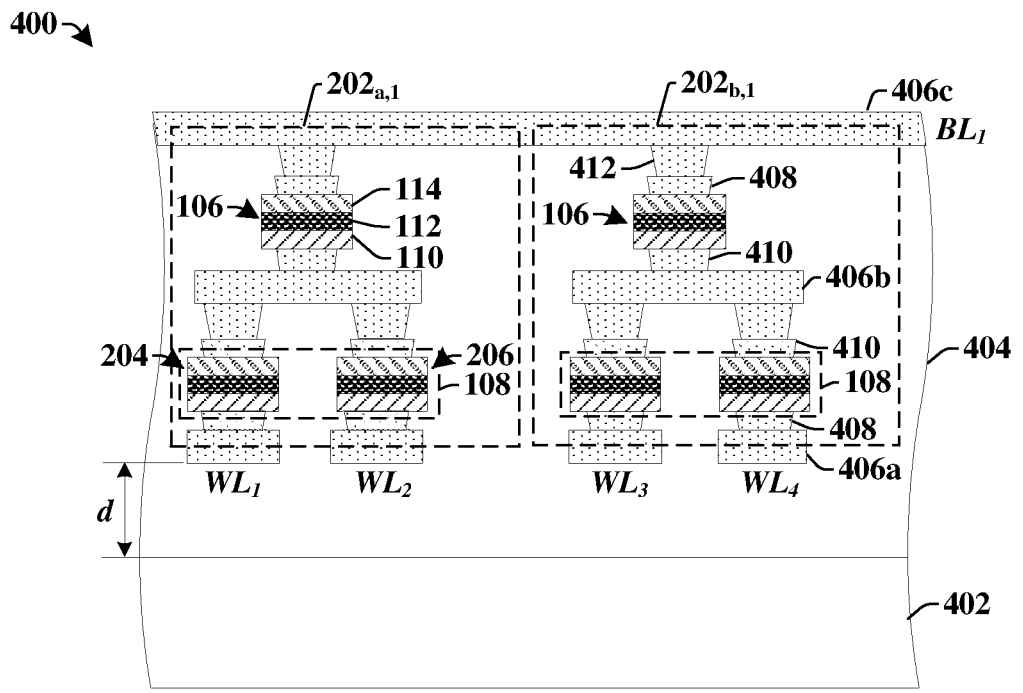
FIGS. 4A-4B illustrate some embodiments of cross-sectional views of an integrated chip corresponding to the disclosed memory circuit of FIG. 2.

FIG. 4A illustrates a cross-sectional view of some embodiments of an integrated chip 400 corresponding to the memory array 102 of FIG. 2.

The integrated chip 400 comprises a dielectric structure 404 arranged over a substrate 402. The dielectric structure 404 surrounds a first memory cell $202_{a,1}$ and a second memory cell $202_{b,1}$ that is positioned laterally adjacent to the first memory cell $202_{a,1}$. The dielectric structure 404 further surrounds a plurality of conductive interconnect layers 406a-406c. In some embodiments, the dielectric structure 404 may comprise a plurality of stacked ILD layers. In various embodiments, the plurality of stacked ILD layers may comprise one or more of silicon oxide, fluorine doped silicon oxide, carbon doped silicon oxide, or the like. In various embodiments, the plurality of conductive interconnect layers 406a-406c may comprise copper, aluminum, tungsten, carbon nanotubes, or the like.

The first memory cell $202_{a,1}$ and the second memory cell $202_{b,1}$ respectively comprise a regulating access apparatus 108 and an operative MTJ device 106. The regulating access apparatus 108 is coupled to a first interconnect layer 406a defining a plurality of word-lines $WL_1$-$WL_4$. Two of the plurality of word-lines $WL_1$-$WL_4$ are coupled to respective memory cells within a row of the memory array 102 of FIG. 2. For example, word-lines $WL_1$-$WL_2$ may be coupled to the first memory cell $202_{a,1}$ in a first row and word-lines $WL_3$-$WL_4$ may be coupled to the second memory cell $202_{b,1}$ in a second row. In some embodiments, the plurality of word-lines $WL_1$-$WL_4$ may be separated from the substrate 402 by a non-zero distance d. A second interconnect layer 406b is arranged between the regulating access apparatus 108 and the operative MTJ device 106. The operative MTJ device 106 is further coupled to a third interconnect layer 406c defining a bit-line $BL_1$ that is coupled to operative MTJ device 106 within memory cells arranged within a column of the memory array 102. For example, the bit-line $BL_1$ is coupled to an operative MTJ device 106 within a column of the memory array 102 of FIG. 2.

In some embodiments, the operative MTJ device 106 is coupled between a bit-line $BL_z$ (z=1,2) and a word-line $WL_x$ (x=1,3) by way of a continuous conductive path that comprises a plurality of conductive interconnect layers 406a-406c and that does not extend through the substrate 402. In some embodiments, the operative MTJ device 106 is not directly over an access transistor device configured to control access to the operative MTJ device 106.

In some embodiments, the regulating access apparatus 108 comprises a first regulating MTJ device 204 and a second regulating MTJ device 206. The first regulating MTJ device 204, the second regulating MTJ device 206, and the operative MTJ device 106 respectively comprise a MTJ vertically arranged between a bottom electrode via 408 and a top electrode via 410. In some embodiments, the top electrode via 410 may be coupled to an overlying interconnect layer by way of a via 412 (e.g., a copper via). In some embodiments, the bottom electrode via 408 and the top electrode via 410 may comprise a metal such as titanium nitride (TiN), tantalum nitride (TaN), titanium (Ti), tantalum (Ta), or the like. In some embodiments, the second interconnect layer 406b continuously extends from directly above the first regulating MTJ device 204 to directly above the second regulating MTJ device 206.

The MTJs of the first regulating MTJ device 204, the second regulating MTJ device 206, and the operative MTJ device 106 respectively comprise a free layer 114 and a pinned layer 110 separated by a dielectric tunnel barrier 112. The free layer 114 has a magnetic moment that is configured to change in response to an electrical signal (e.g., a current). The pinned layer 110 has a fixed magnetic direction configured to act as a reference magnetic direction and/or to reduce a magnetic impact on the free layer 114. In some embodiments, one or more of the MTJs may comprise additional layers. For example, in some embodiments, one or more of the MTJs may comprise an anti-ferromagnetic layer between the bottom electrode via 408 and a first pinned layer. In other embodiments, one or more of the MTJs may comprise additional pinned layers (e.g., a first additional pinned layer, a second additional pinned layer, etc.) and/or additional free layers (e.g., a first additional free layer, a second additional free layer, etc.) arranged in various ways to improve performance of the MTJs.

Figure 4B:
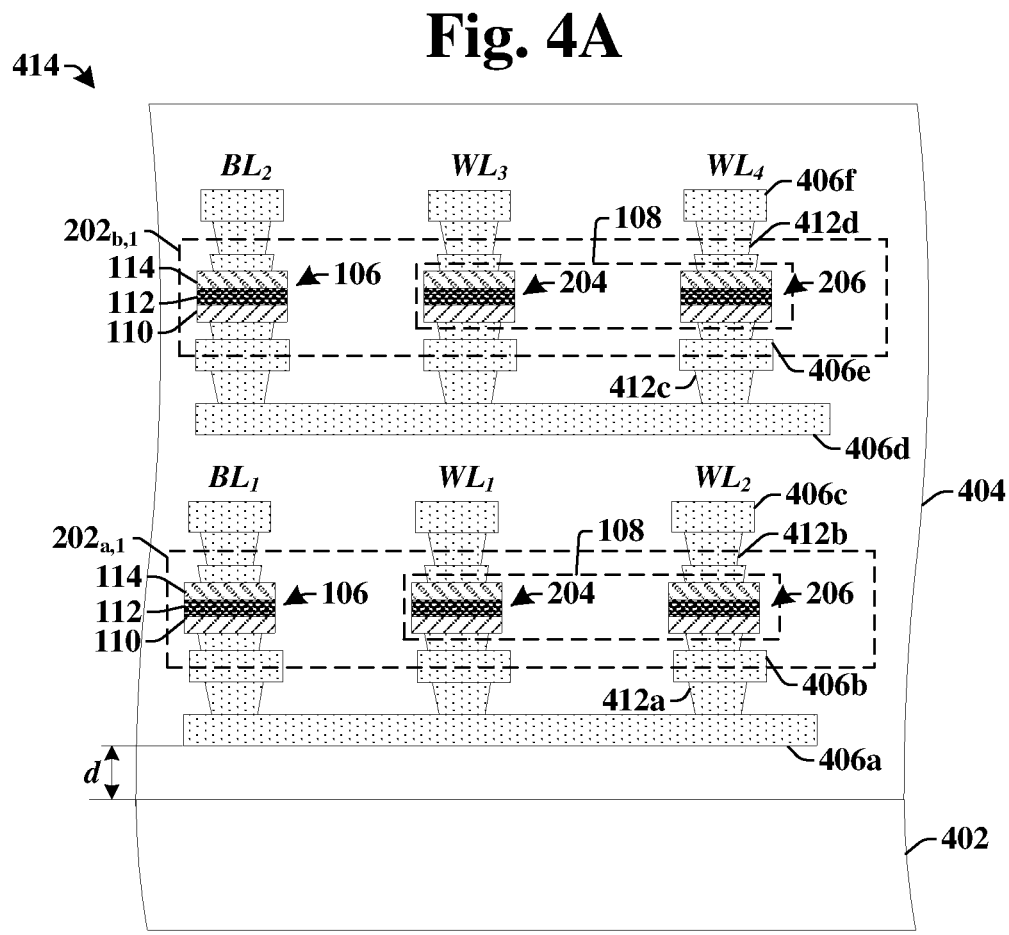

FIG. 4B illustrates a cross-sectional view of some alternative embodiments of an integrated chip 414 corresponding to the memory array 102 of FIG. 2.

The integrated chip 414 comprises a dielectric structure 404 arranged over a substrate 402. The dielectric structure 404 surrounds a first memory cell $202_{a,1}$. The first memory cell $202_{a,1}$ comprises an operative MTJ device 106 and a regulating access apparatus 108 having a first regulating MTJ device 204 and a second regulating MTJ device 206.

The dielectric structure 404 further surrounds a plurality of conductive interconnect layers 406a-406f. The plurality of conductive interconnect layers 406a-406f comprise a first interconnect layer 406a extending as a continuous structure directly below an operative MTJ device 106, a first regulating MTJ device 204, and a second regulating MTJ device 206 of the first memory cell $202_{a,1}$. The first interconnect layer 406a is coupled to the operative MTJ device 106, the first regulating MTJ device 204, and the second regulating MTJ device 206 of the first memory cell $202_{a,1}$ by way of a second interconnect layer 406b and a first plurality of vias 412a. A third interconnect layer 406c has discrete interconnect structures that define two word-lines $WL_1$-$WL_2$ that are coupled to respective memory cells within a column of the memory array 102 of FIG. 2 and a bit-line $BL_1$ that is coupled to respective memory cells within a row of the memory array 102 of FIG. 2. In some embodiments, the operative MTJ device 106, the first regulating MTJ device 204, and the second regulating MTJ device 206 of the first memory cell $202_{a,1}$ may be coupled to the third interconnect layer 406c by way of a second plurality of vias 412b.

In some embodiments, one or more additional memory cells may be arranged over the first memory cell $202_{a,1}$. In such embodiments, a fourth interconnect layer 406d extends as a continuous structure directly below an operative MTJ device 106, a first regulating MTJ device 204, and a second regulating MTJ device 206 of the second memory cell $202_{b,1}$. The fourth interconnect layer 406d is coupled to the operative MTJ device 106, the first regulating MTJ device 204, and the second regulating MTJ device 206 of the second memory cell $202_{a,2}$ by way of a fifth interconnect layer 406e and a third plurality of vias 412c. A sixth interconnect layer 406f defines two of word-lines $WL_3$-$WL_4$ that are coupled to respective memory cells within a column of the memory array 102 of FIG. 2 and a bit-line $BL_2$ that is coupled to respective memory cells within a row of the memory array 102 of FIG. 2. In some embodiments, the operative MTJ device 106, the first regulating MTJ device 204, and the second regulating MTJ device 206 of the second memory cell $202_{a,2}$ may be coupled to the sixth interconnect layer 406f by way of a fourth plurality of vias 412d.

In other embodiments (not shown), one or more additional memory cells may be arranged laterally adjacent to the first memory cell $202_{a,1}$. In some such embodiments, the memory cells within a memory array may be arranged laterally adjacent to one another on same interconnect layers.

It will be appreciated that the integrated chips, 400 and 414, shown in FIGS. 4A-4B are two non-limiting embodiments of an integrated chip that could implement the memory array 102 of FIG. 2 and that other implementations may be used in alternative embodiments.

In some embodiments, the regulating MTJ devices within a regulating access apparatus may have a same size. In other embodiments, the regulating MTJ devices within a regulating access apparatus may have different sizes from each other and/or from an operative MTJ device. For example, FIG. 5A illustrates a schematic diagram of some additional embodiments of a memory circuit 500 having a regulating access apparatus comprising regulating devices having different sizes.

The memory circuit 500 comprises a plurality of memory cells $502_{a,1}$-$502_{c,3}$ respectively comprising an operative MTJ device 106 configured to store data and a regulating access apparatus 108 configured selectively provide access to the operative MTJ device 106. The regulating access apparatus 108 comprises a first regulating MTJ device 504 and a second regulating MTJ device 506 coupled to a same layer of the operative MTJ device 106. The first regulating MTJ device 504 is coupled between a first word-line (e.g., $WL_1$) and the operative MTJ device 106, while the second regulating MTJ device 506 is coupled between a second word-line (e.g., $WL_2$) and the operative MTJ device 106. The operative MTJ device 106 is further coupled to a first bit-line (e.g., $BL_1$).

Figure 5A:
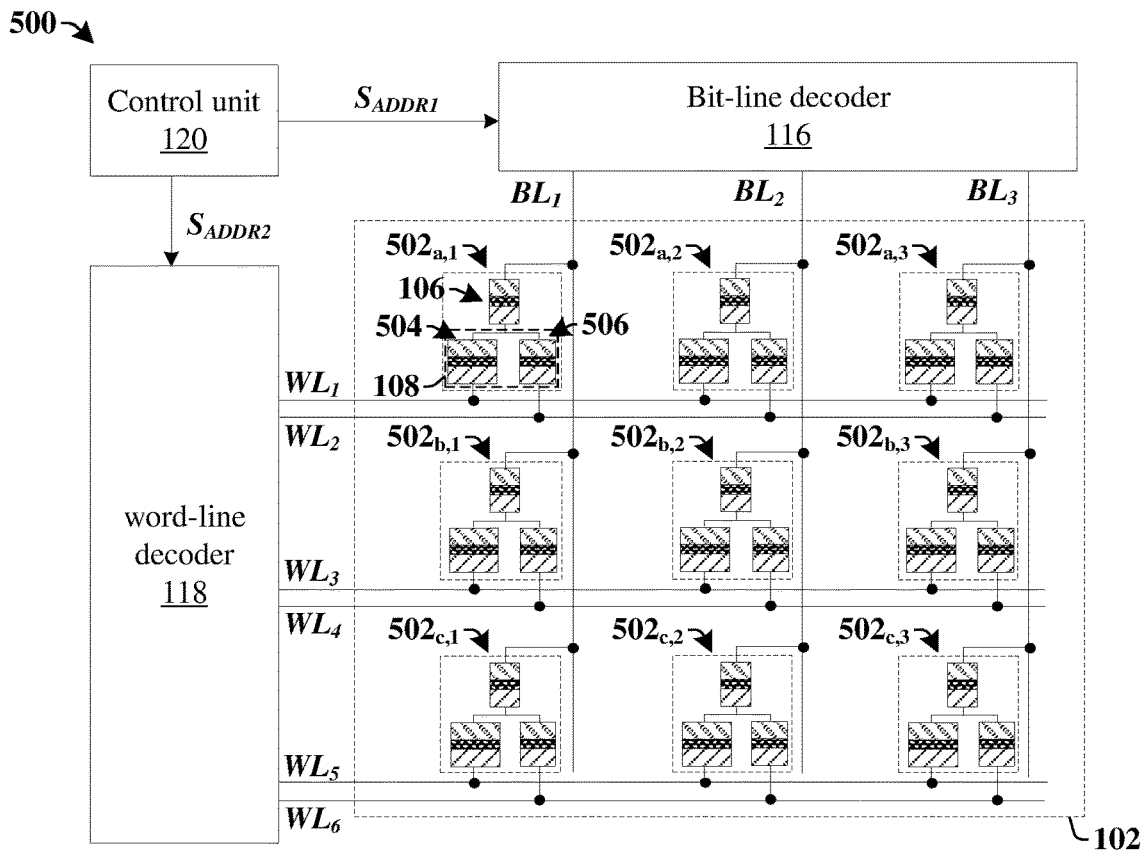
FIGS. 5A-5B illustrate some additional embodiments of a memory circuit having a regulating access apparatus configured to selectively provide access to an operative MTJ device.
Figure 5B:
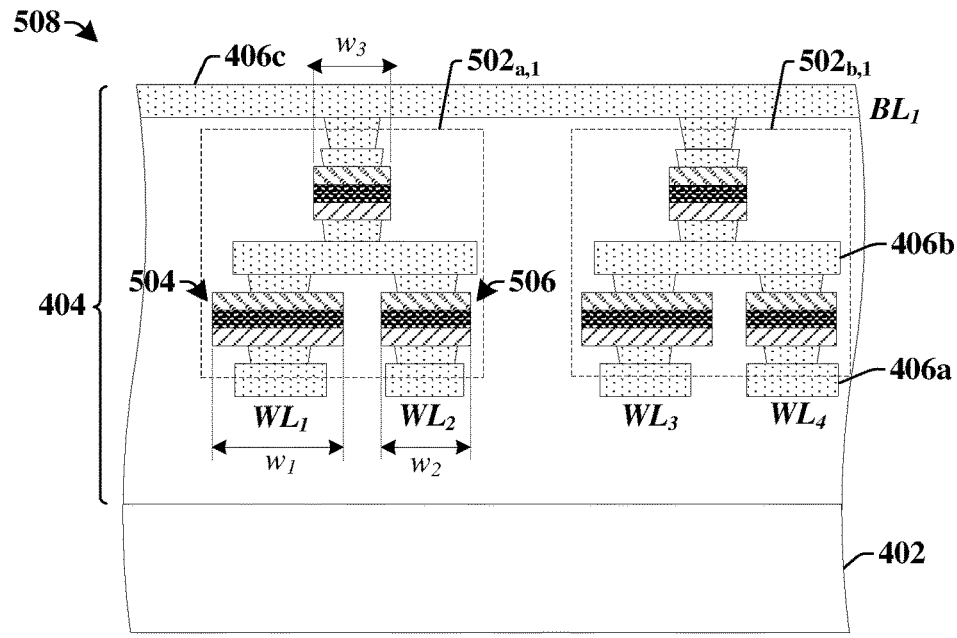

FIG. 5B illustrates a cross-sectional view 508 of some embodiments of an integrated circuit corresponding to the memory circuit 500 of FIG. 5A. As shown in cross-sectional view 508, the first regulating MTJ device 504 has a first size (e.g., a first width $w_1$) and the second regulating MTJ device has a second size (e.g., a second width $w_2$) that is different than the first size. The first size of the first regulating MTJ device 504 gives the first regulating MTJ device 504 a larger switching current, which can allow for larger currents. In some embodiments, the operative MTJ device 106 has a third size (e.g., a third width $w_3$) that is different than the first size and the second size.

Figure 6A:
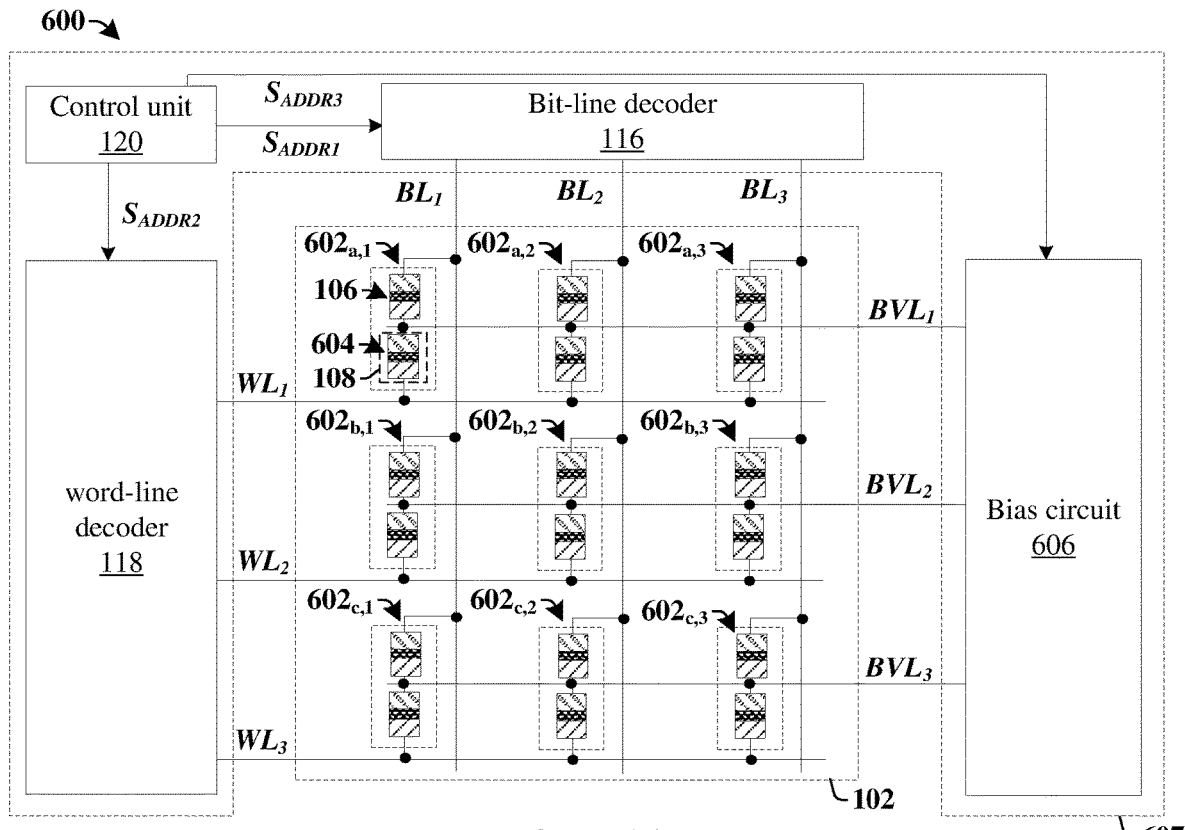
FIGS. 6A-6B illustrate some additional embodiments of a memory circuit having a regulating access apparatus configured to selectively provide access to an operative MTJ device.
Figure 6B:
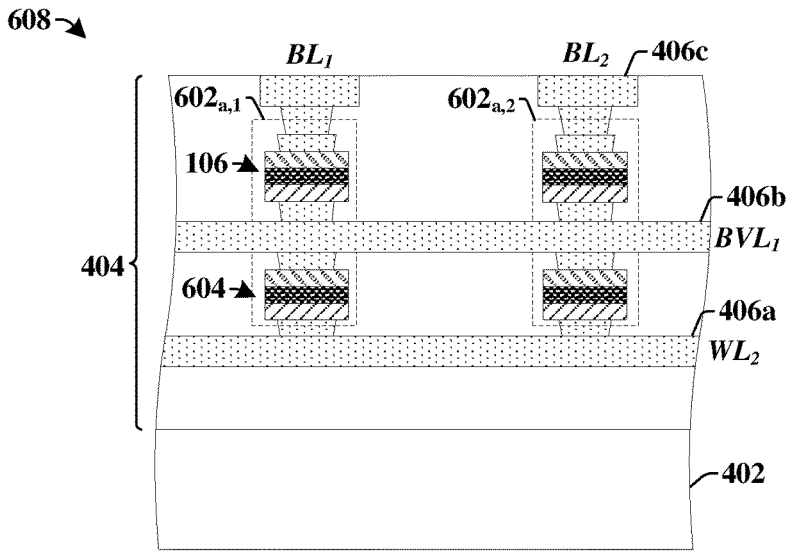

FIGS. 6A-6B illustrate some additional embodiments of an integrated chip comprising a memory circuit having a regulating access apparatus configured to selectively provide access to an operative MTJ device.

FIG. 6A illustrates a schematic diagram of a memory circuit 600 having a plurality of memory cells $602_{a,1}$-$602_{c,3}$ arranged in rows and columns. The plurality of memory cells $602_{a,1}$-$602_{c,3}$ respectively comprise an operative MTJ device 106 configured to store data and a regulating access apparatus 108 configured selectively provide access to the operative MTJ device 106. The regulating access apparatus 108 comprises a regulating MTJ device 604 coupled between a word-line $WL_x$ (x=1, 2, 3) and a bias-voltage-line $BVL_y$ (y=1, 2, 3). The operative MTJ device 106 is coupled between the bias-voltage-line $BVL_y$ and a bit-line $BL_z$ (z=1, 2, 3).

The plurality of memory cells $602_{a,1}$-$602_{c,3}$ are coupled to control circuitry 607. The control circuitry 607 comprises a bit-line decoder 116 configured to selectively apply signals to one or more of the bit-lines $BL_z$, a word-line decoder 118 configured to selectively apply signals to one or more of the word-lines $WL_x$, and a bias circuit 606 configured to selectively apply signals to one or more of the bias-voltage-lines $BVL_y$. In some embodiments, the word-line decoder 118 and the bias circuit 606 may comprise a same circuit element (i.e., the word-line decoder 118 may apply signals to the bias-voltage-lines $BVL_y$).

During operation, to access an operative MTJ device 106, the bias circuit 606 and the word-line decoder 118 can apply voltages to the bias-voltage-lines $BVL_y$ and the word-lines WL, so as to set a value of the regulating MTJ device 604 within a row of the memory array 102. The bit-line decoder 116 can subsequently apply bit-line voltages that allow for a selected one of the plurality of memory cell $602_{a,1}$-$602_{c,3}$ to be accessed without accessing unselected ones of the plurality of memory cell $602_{a,1}$-$602_{c,3}$.

For example, to write data to an operative MTJ device 106 within a first memory cell $602_{a,1}$, a first set of bias voltages may be applied to a first word-line $WL_1$ and to a first bias-voltage-line $BVL_1$. The first set of bias voltages give regulating access apparatus 108 within a first row a low resistance. A second set of bias voltages may be applied to a bias-voltage-line $BVL_2$ and to word-lines $WL_1$ in other rows, so as to give regulating access apparatus 108 within other rows a high resistance. A bit-line voltage is then applied to the first bit-line $BL_1$. A low resistance of the regulating access apparatus within the first memory cell $602_{a,1}$ causes large current (e.g., greater than a switching current) to flow through the operative MTJ device within the first memory cell $602_{a,1}$, while a high resistance of the regulating access apparatus within the second memory cell $602_{a,2}$ causes low current (e.g., smaller than a switching current) to flow through the operative MTJ device within the second memory cell $602_{a,1}$.

FIG. 6B illustrates a cross-sectional view 608 of some embodiments of an integrated circuit corresponding to the memory circuit 600 of FIG. 6A.

Figure 7A:
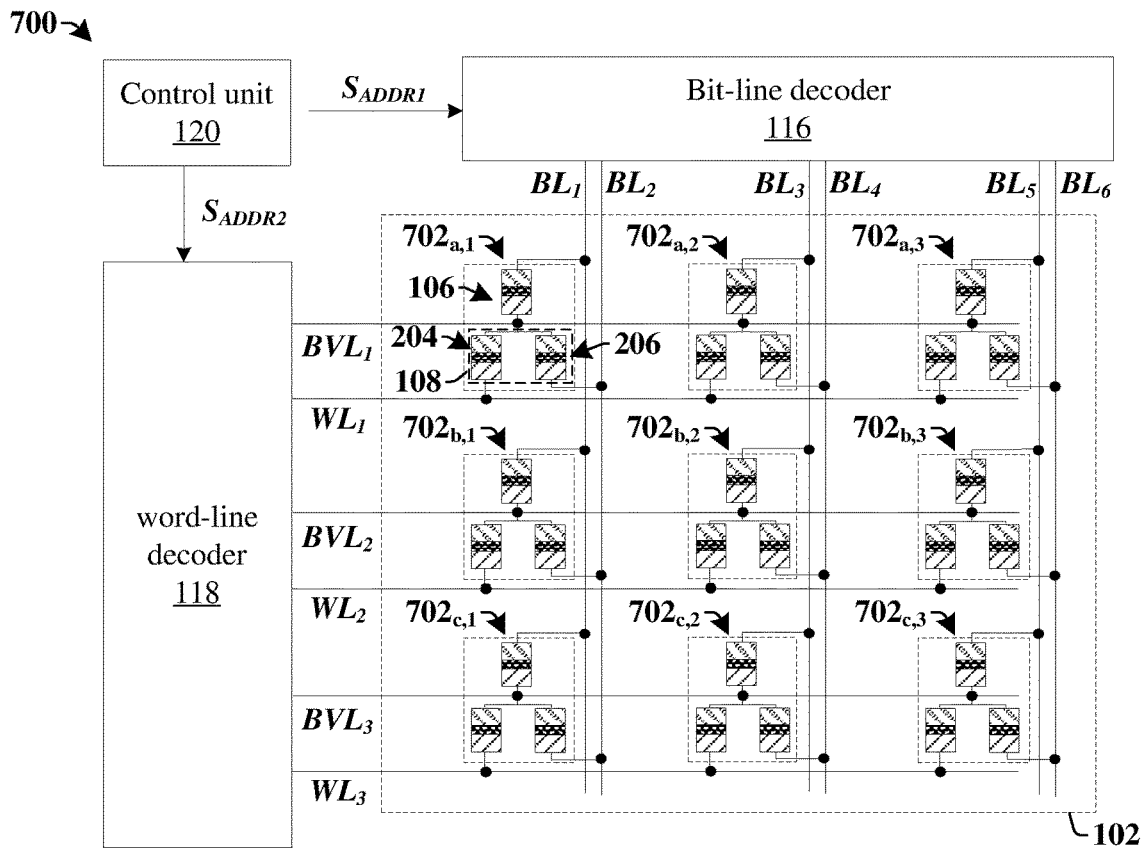
FIGS. 7A-7B illustrate some additional embodiments of a memory circuit having a regulating access apparatus configured to selectively provide access to an operative MTJ device.
Figure 7B:
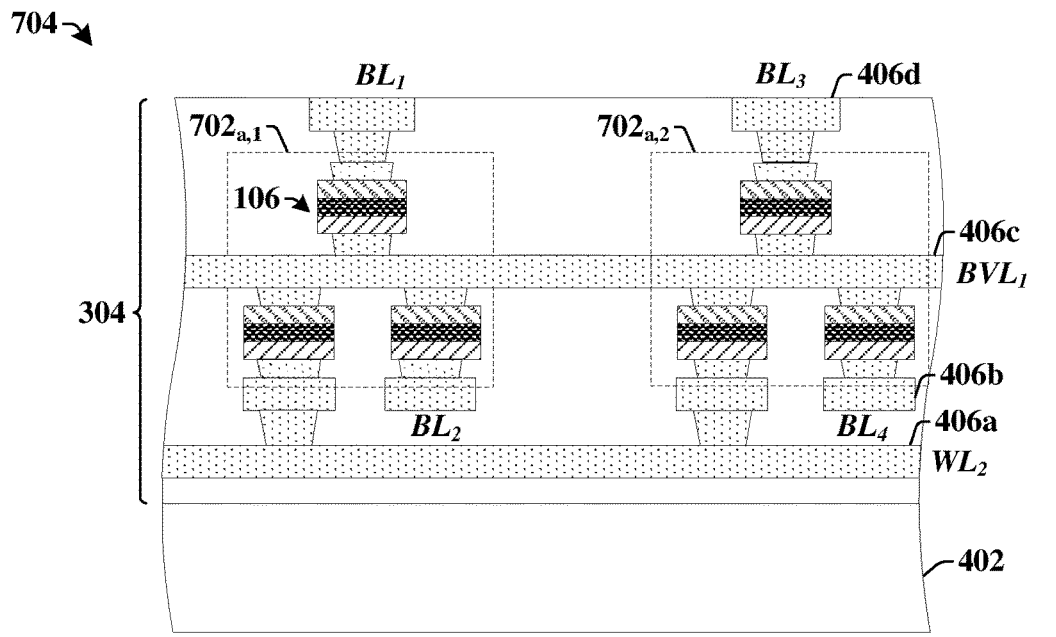

FIGS. 7A-7B illustrate some additional embodiments of an integrated chip comprising a memory circuit having a regulating access apparatus configured to selectively provide access to an operative MTJ device.

FIG. 7A illustrates a schematic diagram of some additional embodiments of a memory circuit 700 having a plurality of memory cells $702_{a,1}$-$702_{c,3}$ arranged in rows and columns. The plurality of memory cells $702_{a,1}$-$702_{c,3}$ respectively comprise an operative MTJ device 106 configured to store data and a regulating access apparatus 108 configured selectively provide access to the operative MTJ device 106.

The regulating access apparatus 108 comprises a first regulating MTJ device 204 and a second regulating MTJ device 206 coupled to a same layer of the operative MTJ device 106. The first regulating MTJ device 204 is coupled between a first one of a plurality of word-lines $WL_1$-$WL_3$ and a first one of a plurality of bias-voltage-lines $BVL_1$-$BVL_3$. The second regulating MTJ device 206 is coupled between a first one of the plurality of bit-lines $BL_1$-$BL_6$ and the first one of the plurality of bias-voltage-lines $BVL_1$-$BVL_3$. The operative MTJ device 106 is coupled between the first one of the plurality of bias-voltage-lines $BVL_1$-$BVL_3$ and a second one of the plurality of bit-lines $BL_1$-$BL_6$.

During operation, a bit-line decoder 116 is configured to selectively apply signals to one or more of the bit-lines $BL_1$-$BL_6$, and a word-line decoder 118 is configured to selectively apply signals to one or more of the word-lines $WL_1$-$WL_3$ and one or more of the bias-voltage-lines $BVL_1$-$BVL_3$. The applied signals cause a current within the first regulating MTJ device 204 to be generated based upon a voltage that is provided to an entire column of the memory array 102, while coupling the regulating access apparatus 108 to the bit-line $BL_2$ causes a current within the second regulating MTJ device 206 to be generated based upon a voltage that is provided to an entire row of the memory array 102. Coupling the regulating access apparatus to bit-lines and word-lines extending in different directions allows for improved isolation between memory cells of the memory array 102.

FIG. 7B illustrates a cross-sectional view 704 of some additional embodiments of an integrated circuit corresponding to the memory circuit 700 of FIG. 7A.

FIGS. 8A-8B illustrate some additional embodiments of an integrated chip comprising a memory circuit having a regulating access apparatus configured to selectively provide access to an operative MTJ device.

FIG. 8A illustrates a schematic diagram of some additional embodiments of a memory circuit 800 having a regulating access apparatus 108 comprising a first regulating MTJ device 804, a second regulating MTJ device 806, and a third regulating MTJ device 808. The first regulating MTJ device 804 is coupled between a first word-line (e.g., $WL_1$) and a first bias-voltage-line (e.g., $BVL_1$), the second regulating MTJ device 806 is coupled between a second word-line (e.g., $WL_2$) and the first bias-voltage-line (e.g., $BVL_1$), the third regulating MTJ device 808 is coupled between the first bias-voltage-line (e.g., $BVL_1$) and the operative MTJ device 106. The operative MTJ device 106 is coupled between the third regulating MTJ device 808 and a first bit-line (e.g., $BL_1$). The inclusion of the third regulating MTJ device 808 gives the regulating access apparatus 108 a greater flexibility in generating different resistances to control a current within an associated operative MTJ device 106.

FIG. 8B illustrates a cross-sectional view 810 of some embodiments of an integrated circuit corresponding to the memory circuit 800 of FIG. 8A.

Although the operations and/or apparatus illustrated in FIGS. 2-8B are described in relation to a regulating access apparatus having regulating MTJ devices, it will be appreciated that the disclosed memory cell is not limited to such an embodiment. Rather, in alternative embodiments the operations and/or apparatus of FIGS. 2-8B may be performed and/or comprise a regulating access apparatus having regulating thin film resistors (e.g., comprising tantalum, tantalum nitride, titanium, tungsten or the like).

FIGS. 9-12 illustrate cross-sectional views 900-1200 of some embodiments of a method of forming an integrated chip having a memory circuit comprising memory cells (e.g., MRAM cells) having a regulating access apparatus configured to selectively provide access to an operative MTJ device. Although FIGS. 9-12 are described in relation to a method, it will be appreciated that the structures disclosed in FIGS. 9-12 are not limited to such a method, but instead may stand alone as structures independent of the method.

Figure 9:
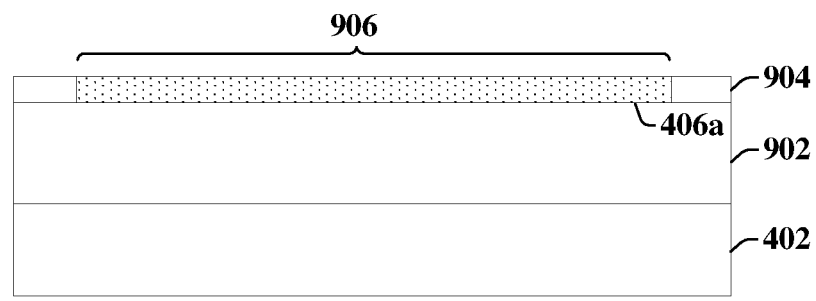
FIGS. 9-12 illustrate some embodiments of a method of forming an integrated chip having a memory circuit including memory cells comprising a regulating access apparatus configured to selectively provide access to an operative MTJ device.

As shown in cross-sectional view 900 of FIG. 9, a first interconnect layer 406a is formed over a substrate 402. In some embodiments, the first interconnect layer 406a is formed by forming a first inter-level dielectric (ILD) layer 904 over the substrate 402. In some embodiments, the first ILD layer 904 may be separated from the substrate 402 by one or more additional dielectric layers 902. The first ILD layer 904 is patterned to define a trench 906. In some embodiments, the first ILD layer 904 may be patterned by forming a patterned masking layer (not shown) over the first ILD layer 904 and performing an etching process to remove parts of the first ILD layer 904 not covered by the patterned masking layer. A conductive material is formed within the trench 906, followed by a subsequent planarization process (e.g., a chemical mechanical planarization process) to form the first interconnect layer 406a.

In various embodiments, the substrate 402 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the first ILD layer 904 may comprise one or more dielectric materials, such as silicon dioxide ($SiO_2$), SiCOH, a fluoro-silicate glass, a phosphate glass (e.g., borophosphate silicate glass), or the like. In some embodiments, the conductive material may comprise a metal (e.g., tungsten, aluminum, etc.) formed by way of a deposition process (e.g., CVD, PVD, PE-CVD, ALD, etc.). In various embodiments, the first interconnect layer 406a can be a first interconnect wire layer, a second interconnect layer, a third interconnect wire layer, or a higher metal interconnect wire layer.

Figure 10:
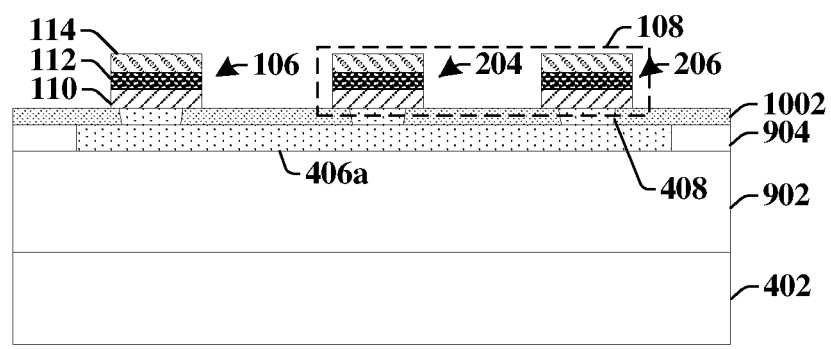

As shown in cross-sectional view 1000 of FIG. 10, a plurality of bottom electrode vias 408 are formed over an upper surface of the first interconnect layer 406a. The plurality of bottom electrode vias 408 are surrounded by a dielectric layer 1002. In some embodiments, the dielectric layer 1002 may be deposited over the first interconnect layer 406a and then selectively patterned to define bottom electrode via openings. The plurality of bottom electrode vias 408 are then formed by way of a deposition process within the bottom electrode via openings. In various embodiments, the dielectric layer 1002 may comprise one or more of silicon carbide, silicon rich oxide, TEOS (tetraethyl orthosilicate), or the like. In various embodiments, the plurality of bottom electrode via 408 may comprise a conductive material such as titanium, titanium nitride, tantalum, or the like.

A plurality of MTJ devices 106, 204, and 206, are formed over the plurality of bottom electrode vias 408. The plurality of MTJ devices 106, 204, and 206, respectively comprise a MTJ having a pinned layer 110 separated from a free layer 114 by a dielectric tunnel barrier 112. In some embodiments, the pinned layer 110 may be formed to contact the bottom electrode vias 408. In other embodiments, the free layer 114 may be formed to contact the bottom electrode vias 408. One of the plurality of MTJ devices 106, 204, and 206, comprise an operative MTJ device 106 configured to store a data state. One or more of the plurality of MTJ devices 106, 204, and 206, comprise regulating MTJ devices, 204 and 206, disposed within a regulating access apparatus 108 configured to control (i.e., regulate) a current provided to an associated operative MTJ device 106.

In some embodiments, the plurality of MTJ devices 106, 204, and 206, may be concurrently formed. For example, in some embodiments, the plurality of MTJ devices 106, 204, and 206, may be formed by depositing a magnetic pinned film over the dielectric layer 1002 and the plurality of bottom electrode vias 408, forming a dielectric barrier film over the magnetic pinned film, and forming a magnetic free film over the dielectric barrier film. One or more patterning processes are performed on the magnetic pinned film, the dielectric barrier layer, and the magnetic free film to define the plurality of MTJ devices 106, 204, and 206. In other embodiments, the plurality of MTJ devices 106, 204, and 206, may be formed at different times.

Figure 11:
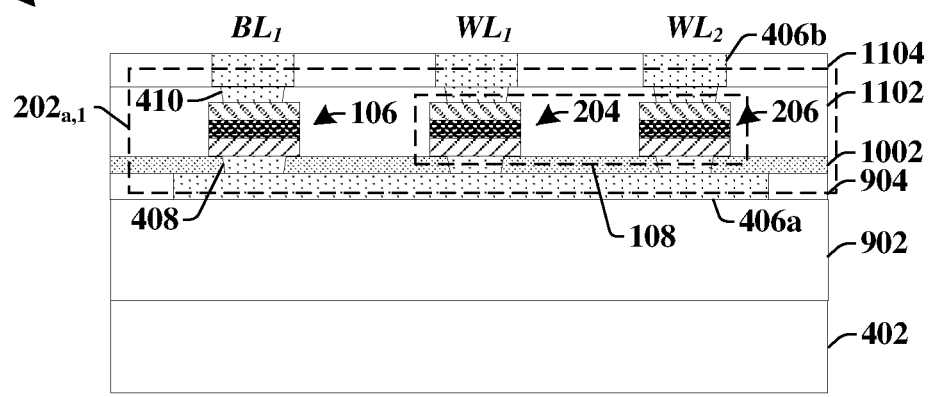

As shown in cross-sectional view 1100 of FIG. 11, a plurality of top electrode vias 410 are formed over the plurality of MTJ devices 106, 204, and 206. The plurality of top electrode vias 410 are surrounded by a second ILD layer 1102. In some embodiments, the second ILD layer 1102 may be deposited over the plurality of MTJ devices 106, 204, and 206 and then selectively patterned to define top electrode via openings. The plurality of top electrode vias 410 are then formed by way of a deposition process within the top electrode via openings. In various embodiments, the second ILD layer 1102 may comprise one or more dielectric materials, such as silicon dioxide ($SiO_2$), SiCOH, a fluorosilicate glass, a phosphate glass (e.g., borophosphate silicate glass), or the like. In various embodiments, the plurality of top electrode vias 410 may comprise a conductive material such as titanium, titanium nitride, tantalum, or the like.

A second interconnect layer 406b is formed within a third ILD layer 1104 over the plurality of MTJ devices 106, 204, and 206. In some embodiments, the second interconnect layer 406b comprises a plurality of interconnect structures defining a bit-line $BL_1$ and one or more word-lines $WL_1$-$WL_2$ of a first memory cell $202_{a,1}$. In some embodiments, the third ILD layer 1104 may comprise a dielectric (e.g., an oxide, a low-k dielectric, or an ultra low-k dielectric) formed by one or more deposition processes (e.g., PVD, CVD, PE-CVD, etc.). The second interconnect layer 406b may be formed by selectively etching the third ILD layer 1104 to form openings within the third ILD layer 1104. A conductive material (e.g., copper and/or aluminum) is then deposited within the openings, followed by a subsequent planarization process (e.g., a chemical mechanical planarization process) to form the second interconnect layer 406b.

Figure 12:
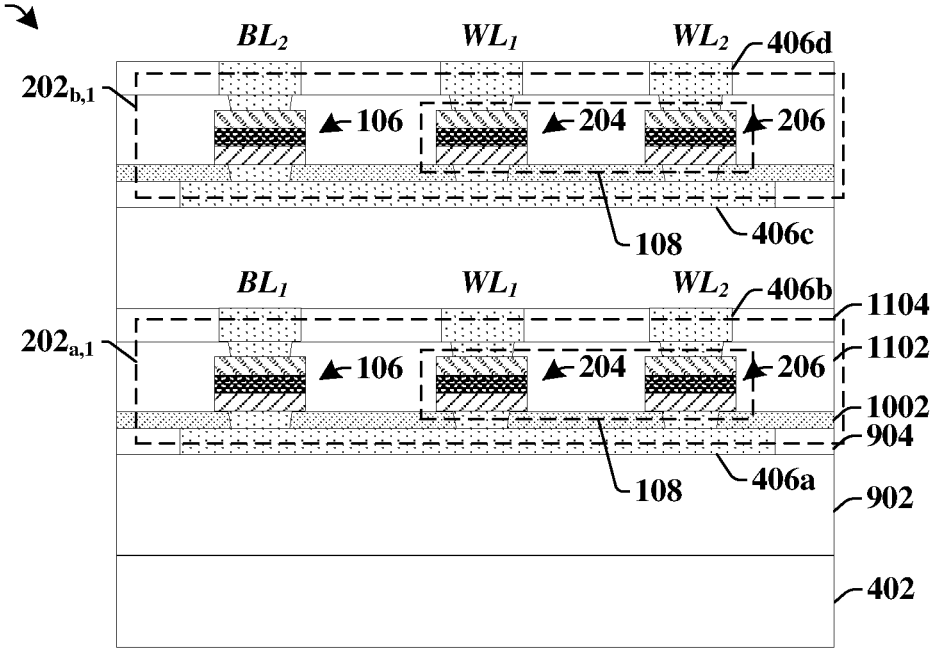

As shown in cross-sectional view 1200 of FIG. 12, a second memory cell $202_{b,1}$ may be formed over the first memory cell $202_{a,1}$. The second memory cell $202_{b,1}$ may comprise an operative MTJ device 106 and a regulating access apparatus 108 having regulating MTJ devices 204 and 206 formed between a third interconnect layer 406c and a fourth interconnect layer 406d. The second memory cell $202_{b,1}$ may be formed according to acts that are analogous to those described in relation to FIGS. 9-11.

Figure 13:
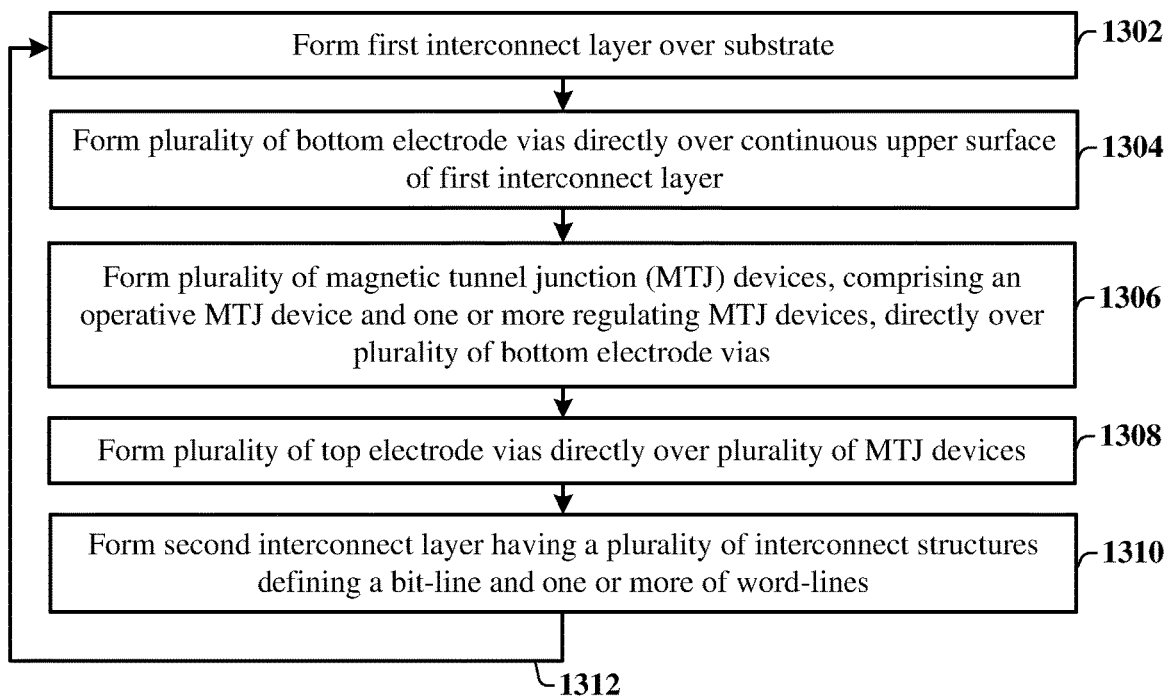
FIG. 13 illustrates a flow diagram of some embodiments of a method of forming an integrated chip having a memory circuit including memory cells comprising a regulating access apparatus configured to selectively provide access to an operative MTJ device.

FIG. 13 illustrates a flow diagram of some embodiments of a method 1300 of forming an integrated chip having a memory circuit comprising memory cells (e.g., MRAM cells) having a regulating access apparatus configured to selectively provide access to an operative MTJ device.

While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a first interconnect layer is formed over a substrate. The first interconnect layer may be formed within a first ILD layer over the substrate. FIG. 9 illustrates a cross-sectional view 900 of some embodiments corresponding to act 1302.

At 1304, a plurality of bottom electrode vias are formed directly over a continuous upper surface of the first interconnect layer. FIG. 10 illustrates a cross-sectional view 1000 of some embodiments corresponding to act 1304.

At 1306, a plurality of MTJ devices are formed directly over the plurality of bottom electrode vias. The plurality of MTJ devices comprise an operative MTJ device and one or more regulating MTJ devices. FIG. 10 illustrates a cross-sectional view 1000 of some embodiments corresponding to act 1306.

At 1308, a plurality of top electrode vias are formed directly over the plurality of MTJ devices. FIG. 11 illustrates a cross-sectional view 1100 of some embodiments corresponding to act 1308.

At 1310, a second interconnect layer having a plurality of interconnect structures are formed over the plurality of top electrode vias. The plurality of interconnect structures define a bit-line and one or more word-lines. FIG. 11 illustrates a cross-sectional view 1100 of some embodiments corresponding to act 1310.

Acts 1302-1310 form a first memory cell over the substrate. In some embodiments, acts 1302-1310 may be repeated (shown as act 1312) to form a second memory cell over the first memory cell. FIG. 12 illustrates a cross-sectional view 1200 of some embodiments corresponding to act 1312.

Although method 1300 describes a method a memory circuit comprising memory cells (e.g., MRAM cells) having a regulating access apparatus comprising MTJ devices, it will be appreciated that in other embodiments, the regulating apparatus may comprise resistors (e.g., thin film resistors). In such embodiments, the operative MTJ device may be formed by a first set of operations (at 1306) while the regulating apparatus comprising resistors may be formed by a second set of separate operations (occurring between 1306 and 1308). For example, after formation of the operative MTJ (at 1306) resistors may be formed by way of one or more deposition and etch processes.

Accordingly, in some embodiments, the present disclosure relates to a memory cell (e.g., an MRAM cell) that does not have a driving transistor (i.e., an access transistor). Rather, the memory cell comprises a regulating access apparatus having one or more regulating MTJ devices configured to selectively provide access to an operative MTJ device.

In some embodiments, the present disclosure relates to an integrated chip. The integrated chip includes an operative magnetic tunnel junction (MTJ) device coupled to a bit-line, the operative MTJ device configured to store a data state; and a regulating access apparatus coupled between the operative MTJ device and a first word-line, the regulating access apparatus including one or more regulating MTJ devices configured to control a current provided to the operative MTJ device. In some embodiments, the one or more regulating MTJ devices respectively include a pinned layer, a dielectric barrier layer, and a free layer separated from the pinned layer by the dielectric barrier layer. In some embodiments, the regulating access apparatus further includes a second regulating MTJ device coupled between a second word-line and the operative MTJ device, the first word-line and the second word-line coupled to a word-line decoder. In some embodiments, the first regulating MTJ device has a larger size than the second regulating MTJ device. In some embodiments, the regulating access apparatus further includes a second regulating MTJ device coupled between a second bit-line and the operative MTJ device, the first word-line coupled to a word-line decoder and the bit-line and the second bit-line coupled to a bit-line decoder. In some embodiments, the operative MTJ device is not directly over an access transistor device. In some embodiments, the integrated chip further includes a bias-voltage-line coupled between the first regulating MTJ device and the operative MTJ device. In some embodiments, the operative MTJ device is laterally separated from the first regulating MTJ device by a dielectric structure disposed over a substrate. In some embodiments, the integrated chip further includes a second operative MTJ device arranged within a memory cell that is directly over the operative MTJ device, the second operative MTJ device configured to store a second data state. In some embodiments, the operative MTJ device is coupled between the bit-line and the first word-line by way of a continuous conductive path that does not extend through the substrate.

In other embodiments, the present disclosure relates to an integrated circuit. The integrated circuit includes a first interconnect layer arranged within a dielectric structure over a substrate, the first interconnect layer separated from the substrate by the dielectric structure; and an operative MTJ device arranged directly over the first interconnect layer and configured to store a data state, the operative MTJ device electrically coupled between a bit-line and a first word-line by way of a continuous conductive path that includes a plurality of interconnect layers and that does not extend through the substrate. In some embodiments, the integrated circuit further includes a regulating access apparatus having a first regulating MTJ device coupled between the first word-line and the operative MTJ device, the first regulating MTJ device having a first pinned layer separated from a first free layer by a first dielectric barrier layer. In some embodiments, the first interconnect layer continuously extends from directly below the operative MTJ device to directly below the first regulating MTJ device. In some embodiments, the integrated circuit further includes a second regulating MTJ device coupled between a second word-line and the operative MTJ device, the first word-line and the second word-line coupled to a word-line decoder. In some embodiments, the first regulating MTJ device has a different size than the second regulating MTJ device. In some embodiments, the integrated circuit further includes a second regulating MTJ device coupled between a second bit-line and the operative MTJ device, the first word-line coupled to a word-line decoder and the second bit-line coupled to a bit-line decoder. In some embodiments, the integrated circuit further includes a bias-voltage-line coupled between the first regulating MTJ device and the operative MTJ device, the bias-voltage-line coupled to a bias circuit configured to selectively apply a bias voltage to the bias-voltage-line.

In yet other embodiments, the present disclosure relates to a method of forming an integrated circuit. The method includes forming a first interconnect layer over a substrate; forming a plurality of MTJ devices directly over the first interconnect layer, the plurality of MTJ devices including an operative MTJ device and one or more regulating MTJ devices configured to selectively control a current flowing to the operative MTJ device; and forming a second interconnect layer over the plurality of MTJ devices, one or both of the first interconnect layer and the second interconnect layer define a bit-line and one or more word-lines. In some embodiments, the one or more regulating MTJ devices respectively include a pinned layer, a free layer, and a dielectric barrier layer disposed between the pinned layer and the free layer. In some embodiments, the method further includes concurrently forming the operative MTJ device and the one or more regulating MTJ devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
an operative memory device; and
a regulating access apparatus coupled to the operative memory device, wherein the regulating access apparatus comprises a first regulating MTJ device having a first width and a second regulating MTJ device having a second width that is different than the first width, the first regulating MTJ device being different than the second regulating MTJ device.

2. The integrated chip of claim 1, wherein an outermost sidewall of the first regulating MTJ device is laterally separated from an outermost sidewall of the second regulating MTJ device by an inter-level dielectric (ILD) structure disposed on a substrate.

3. The integrated chip of claim 2, further comprising:
an interconnect wire disposed within the ILD structure, wherein the interconnect wire continuously extends from directly above or below the first regulating MTJ device to directly above or below the second regulating MTJ device.

4. The integrated chip of claim 3, further comprising:
a first interconnect via disposed vertically between the interconnect wire and the first regulating MTJ device; and
a second interconnect via disposed vertically between the interconnect wire and the second regulating MTJ device.

5. The integrated chip of claim 3, wherein the interconnect wire continuously extends to directly below the operative memory device.

6. The integrated chip of claim 2, wherein the first regulating MTJ device, the second regulating MTJ device, and the operative memory device are substantially equal distances over the substrate.

7. The integrated chip of claim 1, wherein the first regulating MTJ device and the second regulating MTJ device respectively comprise a regulating free layer, a regulating dielectric barrier layer on the regulating free layer, and a regulating pinned layer separated from the regulating free layer by the regulating dielectric barrier layer.

8. The integrated chip of claim 1, wherein the operative memory device comprises an operative MTJ device having a third width that is different than the first width and the second width.

9. An integrated chip, comprising:
an operative memory device;
a regulating access apparatus coupled to the operative memory device and comprising regulating MTJ devices respectively including a regulating free layer, a regulating dielectric barrier layer, and a regulating pinned layer separated from the regulating free layer by the regulating dielectric barrier layer, wherein the regulating pinned layer continuously extends between opposing outermost sidewalls of the regulating dielectric barrier layer; and
wherein the regulating access apparatus comprises a first regulating MTJ device having a first width and a second regulating MTJ device having a second width that is different than the first width, the first regulating MTJ device being different than the second regulating MTJ device.

10. The integrated chip of claim 9, further comprising:
an interconnect disposed within an inter-level dielectric (ILD) layer and contacting the first regulating MTJ device, wherein the regulating pinned layer of the first regulating MTJ device laterally extends past an outermost sidewall of the interconnect.

11. The integrated chip of claim 9, wherein the regulating pinned layer of the first regulating MTJ device covers an entirety of a surface of the regulating dielectric barrier layer that faces away from the regulating free layer.

12. The integrated chip of claim 9, wherein a surface of the regulating free layer of the first regulating MTJ device that faces towards the regulating pinned layer has a width that is substantially equal to a width of a surface of the regulating dielectric barrier layer that faces away from the regulating pinned layer.

13. The integrated chip of claim 9, further comprising:
an inter-level dielectric (ILD) structure disposed over a semiconductor substrate and surrounding the regulating access apparatus, wherein the first regulating MTJ device is completely separated from the second regulating MTJ device by the ILD structure.

14. The integrated chip of claim 13, further comprising:
an interconnect contacting a center of a bottommost surface of the regulating pinned layer of the first regulating MTJ device.

15. An integrated chip, comprising:
an operative memory device;
a first regulating MTJ device comprising a first regulating free layer coupled to the operative memory device, a first regulating dielectric barrier layer on the first regulating free layer, and a first regulating pinned layer coupled to a first interconnect and separated from the first regulating free layer by the first regulating dielectric barrier layer;
a second regulating MTJ device comprising a second regulating free layer coupled to the operative memory device, a second regulating dielectric barrier layer on the second regulating free layer, and a second regulating pinned layer coupled to a second interconnect and separated from the second regulating free layer by the second regulating dielectric barrier layer; and
wherein the first regulating MTJ device has a first width and the second regulating MTJ device has a second width that is different than the first width.

16. The integrated chip of claim 15, wherein the first regulating free layer is laterally separated from the second regulating free layer by an inter-level dielectric (ILD) layer disposed over a semiconductor substrate.

17. The integrated chip of claim 15, wherein the first regulating MTJ device is configured to provide a first switching current and the second regulating MTJ device is configured to provide a second switching current that is different than the first switching current.

18. The integrated chip of claim 15, wherein the operative memory device has a width that is different than the first width of the first regulating MTJ device and the second width of the second regulating MTJ device.

19. The integrated chip of claim 15, wherein the first regulating MTJ device has a topmost surface and a bottommost surface with substantially equal widths.

20. The integrated chip of claim 15, wherein the first regulating MTJ device and the second regulating MTJ device are configured to selectively provide access to the operative memory device by controlling a current that is provided to the operative memory device.

* * * * *